United States Patent [19]

Botez

[11] 4,426,701

[45] Jan. 17, 1984

[54] CONSTRICTED DOUBLE HETEROSTRUCTURE SEMICONDUCTOR LASER

[75] Inventor: Dan Botez, Mt. Holly, N.J.

[73] Assignee: RCA Corporation, New York, N.Y.

[21] Appl. No.: 333,767

[22] Filed: Dec. 23, 1981

[51] Int. Cl.³ .............................................. H01S 3/19
[52] U.S. Cl. ....................................... 372/45; 357/17; 372/48
[58] Field of Search ....................... 372/44, 45, 46, 48; 357/17

[56] References Cited

U.S. PATENT DOCUMENTS

| | | | |
|---|---|---|---|
| 3,753,801 | 8/1973 | Lockwood et al. | 148/171 |
| 4,215,319 | 9/1980 | Botez | 331/94.5 |
| 4,383,320 | 5/1983 | Botez et al. | 372/45 |

Primary Examiner—James W. Davie
Attorney, Agent, or Firm—Birgit E. Morris; Donald S. Cohen; William J. Burke

[57] ABSTRACT

The invention is a semiconductor laser which includes a substrate with a pair of substantially parallel grooves in a surface thereof with a mesa therebetween where the height of the surface of the mesa above the bottom of the grooves is different than the height of the major surface of the substrate above the bottom of the grooves. Layers deposited on this substrate exhibit an increased taper in thickness in the lateral direction.

11 Claims, 5 Drawing Figures

CONSTRICTED DOUBLE HETEROSTRUCTURE SEMICONDUCTOR LASER

The Government has rights in this invention pursuant to a Government contract.

The invention relates to a constricted double heterostructure semiconductor laser exhibiting increased curvature and taper of its layers.

BACKGROUND OF THE INVENTION

Botez, in U.S. Pat. No. 4,215,319, incorporated herein by reference, has disclosed a constricted double heterostructure laser, composed of Group III-V compounds and alloys of such compounds, which includes a substrate having a pair of spaced, substantially parallel grooves with a mesa therebetween in a surface thereof. A first confinement layer overlies the surface of the substrate, the mesa and the surfaces of the grooves, an active layer overlies the first confinement layer and a second confinement layer overlies the active layer. The active layer tapers in increasing or decreasing thickness in the lateral direction, the direction in the plane of the layers and perpendicular to the axis of the grooves, depending upon the crystallographic orientation of the substrate surface and the surface curvature of any underlying layer. Botez, in U.S. Patent application Ser. No. 251,651 filed Apr. 6, 1981, U.S. Pat. No. 4,347,486, and incorporated herein by reference, has disclosed a constricted double heterostructure laser having a guide layer which is interposed between the first confinement layer and the active layer and which also tapers in thickness in the lateral direction. Botez et al. in U.S. Patent application Ser. No. 257,773 filed Apr. 27, 1981, U.S. Pat. No. 4,383,320, have disclosed a laser having a guide layer wherein the surface which contacts the active layer has a concave shape in the lateral direction over the mesa between the grooves and tapers in increasing thickness in the lateral direction.

In each of these lasers the deposition of the layers on the substrate surface, the grooves and the mesa is non-uniform because the layer growth is faster over concave portions than over flat or convex portions of the surface. This non-uniform growth produces the curvature of the deposited layers and the resulting taper. The degree of curvature, and thus the yield of useful devices, obtained is, however, sensitive to the thicknesses of the deposited layers and fluctuations in the growth conditions.

A change in the structure of these devices which produced an increase in the curvature of the deposited layers and increased the yield of useful devices would thus be desireable.

SUMMARY OF THE INVENTION

The invention is a semiconductor laser with a mesa between a pair of substantially parallel grooves in a surface of a substrate wherein the mesa has a different height above the bottom of the grooves than does the remainder of a substrate surface. A mesa having a height less than that of the substrate surface produces greater positive (concave) curvature while a mesa having a height greater than that of the substrate surface produces a greater negative (convex) curvature of the surfaces of a layer deposited thereon.

DETAILED DESCRIPTION

Figure 1:
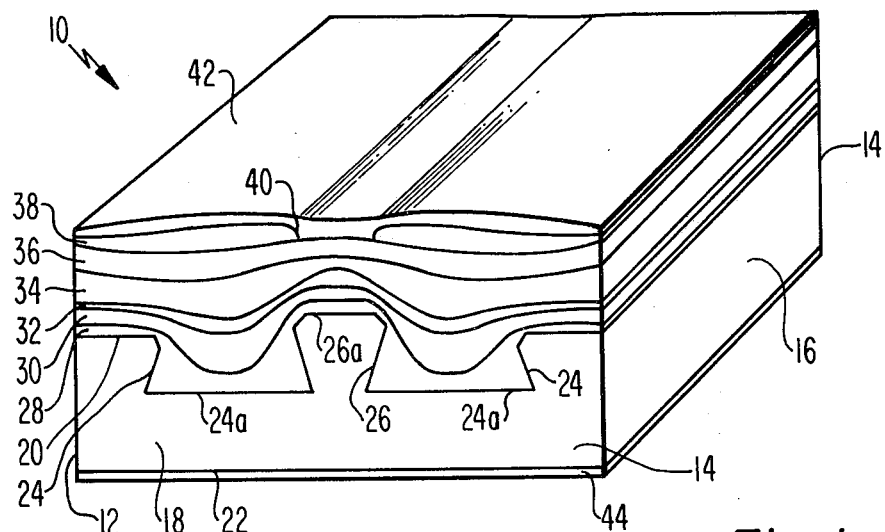
FIGS. 1 and 2 are perspective views of two embodiments of the invention.

Referring to FIG. 1, a semiconductor injection laser 10 incorporating the present invention comprises a body 12 of single crystal semiconductor material, typically Group III-V compounds or alloys of such compounds, in the form of a parallelopiped. The body 12 has spaced, parallel end faces 14 which are partially reflecting of light, with at least one of the end faces 14 being partially transparent so that light may be emitted therefrom. The body 12 also includes spaced, parallel side surfaces 16 which extend between and are perpendicular to the end faces 14. The semiconductor body 12 includes a substrate 18 having spaced, parallel major surfaces 20 and 22 which extend between and are perpendicular to both the end faces 14 and the side surfaces 16 of the semiconductor body 12. In the major surface 20 of the substrate 18 is a pair of spaced, substantially parallel grooves 24 which extend between the end faces 14. The portion of the body between the grooves 24 forms a mesa 26 whose surface 26a has a greater height above the bottoms 24a of the grooves 24 than does the major surface 20. A buffer layer 28 overlies the major surface 20, the surface of the mesa 26a and partially fills the grooves 24. A first confinement layer 30 overlies the buffer layer 28 and an active layer 32 overlies the first confinement layer 30. A second confinement layer 34 overlies the active layer 32 and a capping layer 36 overlies the second confinement layer 34. An electrically insulating layer 38 overlies the capping layer 36 and has an opening 40 extending therethrough in the form of a stripe over the mesa 26 and extending between the end faces 14. A first electrical contact 42 overlies the electrically insulating layer 38 and a portion of the capping layer 36 and the region of the opening 40. A second electrical contact 44 overlies the second major surface 22 of the substrate 18.

Figure 2:
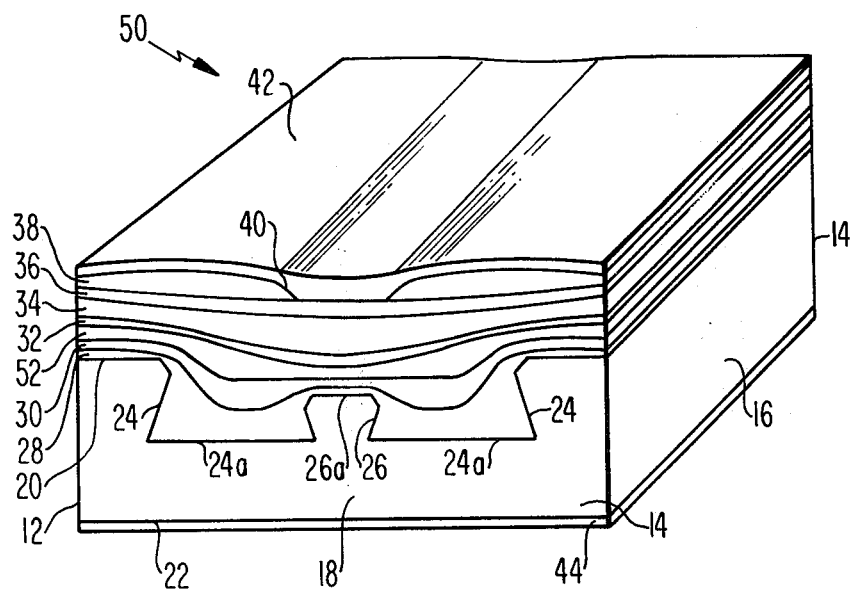
Figure 3:
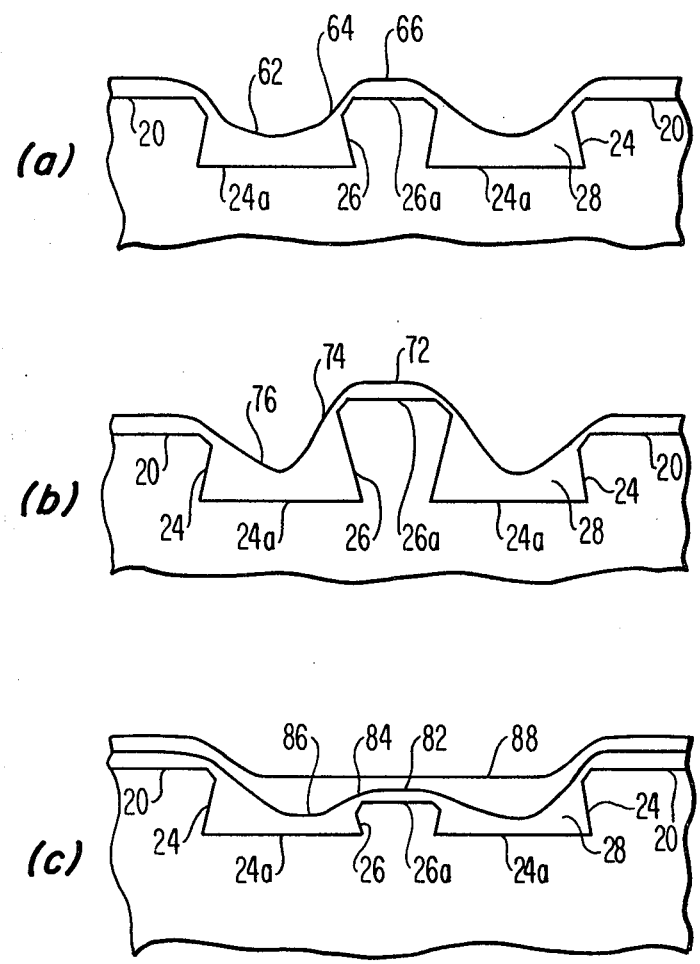
FIGS. 3(a), (b) and (c) are sectional views of a portion of a semiconductor laser showing mesas of different heights.

The identification of the common elements of FIGS. 1, 2 and 3 is the same.

Referring to FIG. 2, a semiconductor injection laser 50 differs from the injection laser 10 of FIG. 1 in that a guide layer 52 is interposed between the first confinement layer and the active layer and that the height of the mesa surface 26a above the bottom 24a of the grooves is less than the height of the surface 20 of the substrate.

The substrate 18, the buffer layer 28, the first confinement layer 30 and the guide layer 52 are of one conductivity type and the second confinement layer 34 and the capping layer 36 are of the opposite conductivity type. The active layer 32 may be of either conductivity type and is typically only lightly electrically conducting. It is to be understood that the conductivity types of each of these layers may be reversed so long as the relationships of the conductivities of the various layers and the substrate is maintained.

The substrate 18 is preferably n-type GaAs having a major surface 20 which is parallel to the (100) crystallographic plane. The substrate 18 may be misoriented from this plane but preferably the direction of any misorientation is parallel to the axis of the grooves.

The grooves 24 are shown in FIGS. 1 and 2 as having a dove-tail shape. Alternatively, the grooves may have a different shape, for example, a vee or rectangular shape. The only requirement on the shape of the grooves is that it be such that, during growth, the cooperative effect of the grooves is to cause the formation of overlying layers of the desired curvature and taper. The shape of the grooves depends upon the crystal orientation of the axis of the grooves and the particular etchant used. For example, an etchant composed of $1H_2SO_4$:8-$H_2O_2$:8$H_2O$ by volume forms dove-tail shape grooves if the axis of the grooves is oriented parallel to the [011] direction, rectangular grooves if the axis of the grooves is parallel to the [010] direction and vee-shaped grooves if the axis of the grooves is parallel to the [011] direction. The grooves are formed using standard photolithographic and chemical etching techniques as disclosed, for example, by Botez in U.S. Pat. No. 4,215,319, referred to above. The grooves 24 may be between about 4 and 12 micrometers ($\mu m$) wide at the surface 20, are typically about 10 $\mu m$ wide and have a depth of between 3 and 6 $\mu m$ and typically about 4 $\mu m$. The center-to-center spacing of the grooves may be between about 20 and about 45 $\mu m$ and is preferably about 32 $\mu m$.

The various expitaxial layers are deposited on the substrate 18 using well-known techniques of liquid phase epitaxy such as is described by Botez in U.S. Pat. No. 4,215,319, referred to above and by H. F. Lockwood et al. in U.S. Pat. No. 3,753,801, which is incorporated herein by reference. In liquid phase epitaxy the local growth rate of a portion of a particular layer will vary with the local curvature of the surface upon which it is grown. The greater the amount of local positive curvature of the surface, i.e. concavity, the higher the local growth rate will be.

Referring to FIG. 3a the height of the surface 26a of the mesa 26 is the same as that of the surface 20 above the bottom 24a of the grooves 24. The deposition rate will be highest at the point 62 of greatest positive curvature, lowest at the poit 64 of greatest negative curvature and be at a rate which is intermediate between these two rates at the point 66 directly over the surface 26a. Thus a layer deposited on this surface will taper in decreasing thickness from the point 66 to the point 64 and then taper in increasing thickness from the point 64 to the point 62.

Referring to FIG. 3b where the height of the surface 26a of the mesa 26 above the bottoms 24a of the grooves 24 is greater than the height of the surface 20, the point 74 at the edge of mesa 26 has a greater negative curvature than the corresponding points 64 of FIG. 3a. Thus, the growth rate at the point 74 will be slower than that at the point 64 thereby producing a greater taper in decreasing thickness from the point 72 directly over the mesa 26 to the point 74 and a corresponding greater taper in increasing thickness from the points 74 to the point 76 over the grooves 24.

Referring to FIG. 3c where the height of the surface 26a of the mesa 26 above the bottom 24a of the grooves 24 is less than the height of the surface 20, the radius of curvature at the point 84 is less than that of the point 64 of FIG. 3a. Thus the taper in decreasing thickness from the point 82 to the point 84 will be less than that from the point 66 to the point 64 of FIG. 3a. Thus a deposited layer will have a greater taper in increasing thickness from the point 82 to the point 84 and from the point 84 to the point 86. Because the growth rate over the point 82 is lower than the growth rate over the surface 20 a positive curvature surface 86 can be grown. If the height of the mesa 26 is less than the height of the surrounding surface 20 with respect to the groove bottoms 24a then the magnitude of the positive curvature will be greater. This results in a guide layer deposited on the surface 88 having a larger increasing lateral taper and an active layer having a larger decreasing taper.

The appropriate height of the surface 26a of the mesa 26 relative to the height of the surface 20 then depends upon the desired taper. For example, for the laser described in FIG. 1 an active layer having a greater taper in decreasing thickness and thus a high mesa is desirable while for the laser described in FIG. 2 a guide layer having a greater taper in increasing thickness and thus a low mesa is desirable.

The grooves 24 may extend into the substrate 18 a distance of between about 3 and about 6 $\mu m$ from the surface 20. The difference between the height of the surface of the mesa and the surface 20 above the bottom 24a of the grooves 24 may typically be up to about 3 $\mu m$ and is preferably between 1 and 2 $\mu m$. If the height of the surface of the mesa is too much lower than that of the surrounding surface, then the desired taper away from the region over the mesa and the degree of electrical confinement desired will not be obtained. It is to be understood that other combinations of groove depths and relative heights of a mesa to the surrounding surface are also included in the scope of the invention.

The materials which compose the active layer 32, the guide layer 52 and the first and second confinement layers 30 and 34 respectively are so chosen that the index of refraction of the active layer 32 is greater than that of the guide layer 52 and the index of refraction of the guide layer 52 is greater than that of the first and second confinement layers 30 and 34, respectively.

The buffer layer 28 may be comprised of n-type GaAs and is typically between about 0.5 and 1 $\mu m$ thick over the mesa 26. The first confinement layer 30 may be composed of n-type $Al_rGa_{1-r}As$ where the fractional concentration r of Al is between about 0.25 and 0.4 and is typically about 0.35. This layer is typically between about 1.5 and 2.0 $\mu m$ thick over the mesa 26. The guide layer 52 is typically between about 0.5 and about 2 $\mu m$ thick over the mesa 26 and may be composed of n-type $Al_sGa_{1-s}As$ where the fractional concentration s of Al is between about 0.13 and about 0.25 and is typically about 0.20. The active layer 32 is typically between about 0.1 and about 0.4 $\mu m$ thick over the mesa 26 and may be composed of $Al_tGa_{1-t}As$ where the fractional concentration t of Al is between about 0.0 and about 0.1. The second confinement layer 34 is typically between about 1 and about 2 $\mu m$ thick over the mesa 26 and may be composed of p-type conductivity $Al_vGa_{1-v}As$ where the fractional concentration v of Al varies between about 0.3 and about 0.4 and is typically about 0.35. The capping layer 36 is typically between about 0.2 and 1.5 $\mu m$ thick and may be composed of p-type GaAs.

It is to be understood that the use of other combinations of Group III-V binary compounds and alloys of such compounds may be used in the laser of the invention.

The electrically insulating layer 38 is preferably composed of silicon dioxide which is deposited on the capping layer 36 by pyrolytic decomposition of a silicon containing gas, such as silane, and oxygen or water vapor. An opening 40 is formed through the electrically insulating layer 38 down to the capping layer 36 over the mesa 26 between the grooves 24 using standard photolithographic masking techniques and etching processes. The first electrical contact 42 is then deposited over the electrically insulating layer 38 and the capping layer 36 in the region of the opening 40 and is preferably composed of titanium, platinum and gold deposited by sequential vacuum evaporation. The second electrical contact 44 to the substrate 18 may be formed by vacuum deposition and sintering of tin and gold.

One of the end faces 14 of the body 12 from which light is emitted is typically coated with a layer of $Al_2O_3$ or similar material having a thickness of about one-half wave at the laser wavelength. Such a layer has been disclosed by Ladany et al. in U.S. Pat. No. 4,178,564, incorporated herein by reference. The opposed end face 14 may be coated with a mirror which is reflecting at the laser wavelength such has been disclosed by Caplan et al. in U.S. Pat. No. 3,701,047 or by Ettenberg in U.S. Pat. No. 4,092,659, both of which are incorporated herein by reference.

A mesa having a different height than the surrounding substrate surface may be formed using standard photolithographic and chemical etching techniques. To form a mesa which is lower than the surrounding substrate surface, the entire surface, including the grooves and the mesa are coated with a layer of $SiO_2$ and with a layer of photoresist. An opening is then formed in the $SiO_2$ layer over the mesa and the exposed surface is etched using an etchant such as that used above to form the grooves. Conversely, to form a mesa which is higher than the surrounding substrate surface the $SiO_2$ layer is removed from this surface rather than the surface of the mesa, and the surface is then etched.

Alternatively, for grooves of particular shapes, such as vee-shaped grooves, the mesa between the grooves will be melt-etched upon initial contact with the liquid solution from which the first layer is to be deposited, thereby reducing the height of the mesa relative to the surrounding surface.

Lateral confinement and mode control of the laser beam in the laser is produced by the variation in the effective refractive index $N_{eff}$ arising from the varying thicknesses of the layers. The lateral thickness variation is related to $N_{eff}$ by:

$$N_{eff} \sim N_c + b_a(x)(N_a - N_c) + b_g(x)(N_g - N_c)$$

where $N_c$, $N_a$ and $N_g$ are the bulk refractive indices of the confinement, active and guide layers respectively with $N_a > N_g > N_c$ and $b_a(x)$ and $b_g(x)$ are the field amplitude filling factors of the active and guide layers respectively as a function of the distance x in the lateral direction from the center point of the mesa. For the laser 10 of FIG. 1 $b_g(x)=0$ since there is no guide layer.

For the laser 10 of FIG. 1 $b_a(x)$ has its maximum value at x=0 and decreases with increasing distance x since the thickness of the active layer is decreasing and thus a smaller fraction of the optical field is in the active layer. The effective refractive index thus decreases with increasing lateral distance producing a positive index guide which confines the propagating beam. A larger taper in decreasing thickness of the active layer will produce a stronger positive index guide and thus improved confinement of the fundamental mode of oscillation.

For the laser 50 of FIG. 2 the active layer tapers in decreasing thickness, the guide layer tapers in increasing thickness and the beam propagates in both the active and guide layers. At the center point of the active layer over the mesa, $b_a(x)$ is large and dominates. With increasing lateral distance x the active layer is thinner, $b_a(x)$ decreases while the guide layer is thicker and $b_g(x)$ increases. Thus, $N_{eff}$ initially decreases with increasing lateral distance and then increases producing what is known as a W-guide from the shape of the effective index profile. A larger taper in decreasing thickness of the active layer and an increasing thickness of the guide layer will produce a stronger positive-index contribution from the active layer in this structure. This results in decreased radiative losses for the fundamental made due to the lateral anti-guiding in the guide layer and increased losses for higher order modes which are more sensitive to the anti-guiding effect of the increase in $N_{eff}$ with increasing guide layer thickness.

Semiconductor lasers were fabricated from a wafer prepared according to the principles of the invention described above. Dove-tail shaped grooves having their axis along the [011] direction were formed in a (100) major surface of an n-type GaAs substrate. The grooves were 10 μm wide at the surface, spaced apart by 32 μm and had a depth of 4 μm. The surface of the mesa was 1 μm below the surface of the surrounding substrate. An n+-type GaAs buffer layer, which was 1 μm thick over the mesa, overlay the surface of the mesa, the substrate and the grooves. An n-type $Al_{0.30}Ga_{0.70}As$ first confinement layer 3 μm thick; an n-type $Al_{0.21}Ga_{0.79}As$ guide layer 1.1 μm thick over the mesa; an undoped $Al_{0.06}Ga_{0.94}As$ active layer 0.2 μm thick over the mesa; a p-type $Al_{0.34}Ga_{0.66}As$ second confinement layer 1.5 μm thick over the mesa; and a p+-type GaAs capping layer 0.5 μm thick overlay the buffer layer. The active layer tapered laterally from the maximum thickness of about 0.2 μm over the center of the mesa to about 0.15 μm at a distance of about 15 μm in the lateral direction. The guide layer tapered from a minimum thickness of about 1.1 μm over the center of the mesa to a thickness of about 1.7 μm at a distance of about 20 μm in the lateral direction.

Lasers fabricated from this wafer were tested using 50 nanosecond current pulses at a 50% duty cycle. Threshold currents of about 90 milliamps and output powers of 50 milliwatts at 170 milliamps were observed.

I claim:

1. In a semiconductor laser comprising a substrate having a pair of opposed major surfaces and a pair of substantially parallel grooves in a first major surface thereof with a mesa therebetween, and an active layer overlying the first major surface of the substrate, the grooves and the surface of the mesa;
   the improvement comprising a mesa having a height above the bottom of the grooves different from that of the first major surface of the substrate.

2. The article of claim 1 wherein the height of the mesa above the bottom of the grooves is greater than that of the first major surface of the substrate.

3. The article of claim 2 wherein the active layer tapers in decreasing thickness in the lateral direction from that portion thereof over the mesa.

4. The article of claim 1 wherein the height of the mesa above the bottom of the grooves is less than that of the first major surface of the substrate.

5. The article of claim 4 wherein a guide layer is interposed between the substrate and the active layer.

6. The article of claim 5 wherein the guide layer tapers in increasing thickness in the lateral direction from the portion thereof over the mesa and the active layer tapers in decreasing thickness from the portion thereof over the mesa.

7. The article of claim 2 or 4 wherein the difference in the height of the mesa and the first major surface of the substrate above the bottom of the grooves is less than 3 micrometers.

8. The article of claim 7 wherein the difference in height of the surface of the mesa and the first major surface of the substrate above the bottom of the grooves is between about 1 and about 2 micrometers.

9. The article of claim 2 or 4 having a first confinement layer interposed between the substrate and the active layer, a second confinement layer overlying the active layer, and first and second electrical contacts overlying at least a portion of the second confinement layer and the second major surface of the substrate respectively.

10. The article of claim 9 wherein a buffer layer is interposed between the substrate and the first confinement layer and wherein a capping layer overlies the second confinement layer, an electrically insulating layer having an opening therethrough overlies the capping layer and the first electrical contact overlies the capping layer in the opening in the electrically insulating layer.

11. The article of claim 10 wherein the substrate is composed of n-type GaAs, the first confinement layer is composed of n-type AlGaAs alloy, the second confinement layer is composed of p-type AlGaAs alloy and the capping layer is composed of p-type GaAs.

* * * * *